(12) United States Patent
Siegel et al.

(10) Patent No.: US 6,771,500 B1
(45) Date of Patent: Aug. 3, 2004

(54) SYSTEM AND METHOD FOR DIRECT CONVECTIVE COOLING OF AN EXPOSED INTEGRATED CIRCUIT DIE SURFACE

(75) Inventors: Harry Michael Siegel, Hurst, TX (US); Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/400,249

(22) Filed: Mar. 27, 2003

(51) Int. Cl.[7] .................................................. H05K 7/20
(52) U.S. Cl. ........................ 361/699; 165/80.4; 257/714
(58) Field of Search ................................. 361/689, 690, 361/698, 699, 704; 257/714, 721; 174/15.1, 16.1, 16.3; 165/80.4, 185

(56) References Cited

U.S. PATENT DOCUMENTS

| | | | | |
|---|---|---|---|---|
| 5,349,831 A | * | 9/1994 | Daikoku et al. | 62/376 |
| 5,522,452 A | * | 6/1996 | Mizuno et al. | 165/286 |
| 5,731,542 A | * | 3/1998 | Limper-Brenner et al. | 174/52.4 |
| 5,768,103 A | * | 6/1998 | Kobrinetz et al. | 361/699 |
| 5,923,086 A | * | 7/1999 | Winer et al. | 257/713 |
| 6,218,730 B1 | * | 4/2001 | Toy et al. | 257/704 |
| 6,351,384 B1 | * | 2/2002 | Daikoku et al. | 361/704 |
| 6,366,462 B1 | * | 4/2002 | Chu et al. | 361/699 |
| 6,498,725 B2 | * | 12/2002 | Cole et al. | 361/700 |
| 6,548,895 B1 | * | 4/2003 | Benavides et al. | 257/712 |
| 6,550,531 B1 | * | 4/2003 | Searls et al. | 165/104.33 |

* cited by examiner

Primary Examiner—Boris Chèrvinsky
(74) Attorney, Agent, or Firm—Lisa K. Jorgenson; William A. Munck

(57) ABSTRACT

The invention comprises a lid that is capable of being placed in contact with and attached to an integrated circuit that has an exposed surface of an integrated circuit die. The lid has portions that form a cavity between a surface of the lid and the exposed surface of the integrated circuit die when the lid is placed in contact with the integrated circuit. The lid also has portions that form a first fluid conduit for transporting a fluid into the cavity and a second fluid conduit for transporting the fluid out of the cavity. Heat from the integrated circuit die is absorbed by the fluid by direct convection and removed from the integrated circuit when the fluid is removed from the cavity.

34 Claims, 11 Drawing Sheets

SYSTEM AND METHOD FOR DIRECT CONVECTIVE COOLING OF AN EXPOSED INTEGRATED CIRCUIT DIE SURFACE

TECHNICAL FIELD OF THE INVENTION

The present invention is directed, in general, to integrated circuits and, more specifically, to a system and method for efficiently extracting heat from an integrated circuit.

BACKGROUND OF THE INVENTION

It is well known that the operation of an integrated circuit generates heat. In many applications an appreciable amount of heat may be generated by the operation of an integrated circuit. In some instances the heat from the operation of an integrated circuit may be dissipated into the surrounding ambient atmosphere through convection. In other instances the amount of heat to be removed that is generated by an integrated circuit may require the use of an external cooling mechanism. An example of an external cooling mechanism is a fan that blows cooling air over an integrated circuit to carry away heat.

In some instances the amount of heat that is generated by an integrated circuit may require a relatively large amount of cooling in order to dissipate the generated heat. For example, a sustained operation of an integrated circuit in a high power application may require an increased level of cooling in order for the integrated circuit to function properly. There is therefore a need for an efficient heat removal process to cool an integrated circuit while the integrated circuit is operating.

Integrated circuit packaging molding technologies have been developed in which portions of an integrated circuit die remain exposed after the molding process has been completed. U.S. Pat. No. 5,897,338 to Kaldenberg describes a method for manufacturing an integrated circuit that leaves a portion of the integrated circuit die exposed.

The integrated circuit die is an active area of an integrated circuit in which electrical currents flow and generate heat. There is therefore a need in the art for an efficient system for removing heat from an integrated circuit die while an integrated circuit die is operating. Specifically, there is a need in the art for an apparatus and method that is capable of efficiently removing heat from an integrated circuit of the type that has an exposed portion of an integrated circuit die.

SUMMARY OF THE INVENTION

It is a primary object of the present invention to provide an apparatus and method for efficiently removing heat from an integrated circuit of the type that has an exposed portion of an integrated circuit die.

In an advantageous embodiment of the present invention, the apparatus comprises a lid that is capable of being placed in contact with and attached to an integrated circuit that has an exposed surface of an integrated circuit die. The lid has portions that form a cavity between a surface of the lid and the exposed surface of the integrated circuit die when the lid is placed in contact with the integrated circuit. The lid also has portions that form within the lid a first fluid conduit for transporting a fluid from a location outside of the integrated circuit into the cavity. The fluid may be a gas or a liquid. The lid also has portions that form within the lid a second fluid conduit for transporting the fluid out of the cavity to a location outside of the integrated circuit.

Fluid is introduced into the cavity through the first fluid conduit. The fluid then absorbs heat from the integrated circuit die. The heated fluid is then removed from the cavity though the second fluid conduit. In this manner heat is efficiently removed from the integrated circuit die. The fluid may be recycled to the cavity after the heat in the fluid has been removed at a location that is outside of the integrated circuit.

It is an object of the present invention to provide an efficient system and method for cooling an integrated circuit of the type that has an integrated circuit die with an exposed surface.

It is also an object of the present invention to provide a lid that can be attached to an integrated circuit in which the lid comprises portions that form a cavity with respect to an integrated circuit die of the integrated circuit when the lid is attached to the integrated circuit package.

It is yet another object of the present invention to provide a lid that can be attached to an integrated circuit in which the lid comprises portions that form a first fluid conduit and a second fluid conduit that have access to a cavity formed with respect to an integrated circuit die of the integrated circuit when the lid is attached to the integrated circuit.

It is another object of the present invention to provide an efficient system and method for providing direct convective cooling of an integrated circuit die in an integrated circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. In particular, a controller may comprise a data processor and an associated memory that stores instructions that may be executed by the data processor. It should be noted that the functionality associated with any particular controller might be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 to 11, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
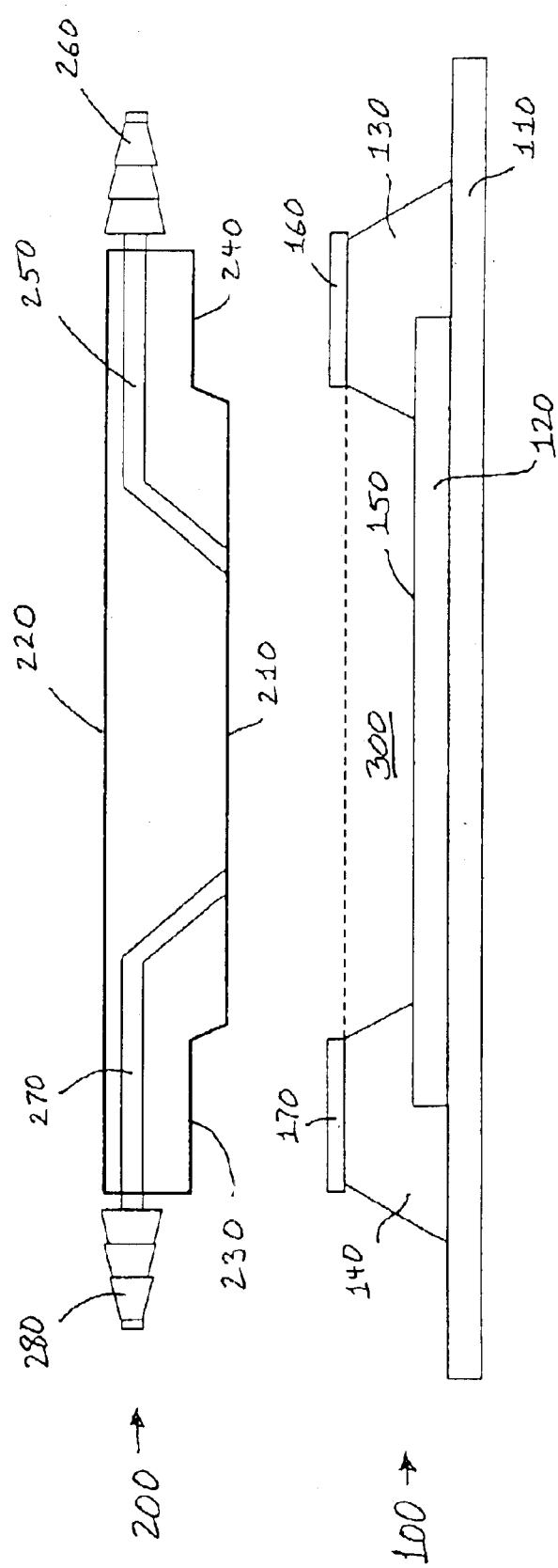
FIG. 1 illustrates a cross sectional view of an integrated circuit comprising an integrated circuit die having an exposed surface and a cross sectional view of a lid comprising first and second fluid conduits, in which the lid has portions that form a cavity between a surface of the lid and the exposed surface of the integrated circuit die when the lid is placed in contact with the integrated circuit in accordance with the principles of the present invention.

FIG. 1 illustrates a cross sectional view of an exemplary integrated circuit 100. Integrated circuit 100 comprises substrate 110, integrated circuit die 120, protective material 130, and protective material 140. Protective material 130 covers a first end of integrated circuit die 120 and protective material 140 covers a second end of integrated circuit die 120. Electrical leads (not shown) connect integrated circuit die 120 to a metal layer (not shown) that is located on substrate 110. Integrated circuit die 120 has an exposed surface 150 that is not covered by protective material 130 or by protective material 140.

The protective material 130 and the protective material 140 may comprise molded plastic material. Plastic molding technology for forming a protective package around integrated circuit die 120 is well known in the art. The term "integrated circuit" and the term "integrated circuit package" are sometimes used to refer to the combined assembly of the substrate 110, the integrated circuit die 150, the protective material 130, the protective material 140, the electrical leads (not shown), and the metal layer (not shown) that is located on substrate 110.

FIG. 1 also illustrates a cross sectional view of a lid 200 that is adapted to fit onto integrated circuit 100. Lid 200 has an interior surface 210 and an exterior surface 220. Lid 200 has portions that form a shoulder 230 generally parallel to interior surface 210 that is adapted to fit onto protective material 140 of integrated circuit 100. Lid 200 also has portions that form a shoulder 240 generally parallel to interior surface 210 that is adapted to fit onto protective material 130 of integrated circuit 100.

When lid 200 is fitted onto integrated circuit 100 the interior surface 210 of lid 200 and the exposed surface 150 of integrated circuit die 120 form a cavity 300. As shown in FIG. 1, the ends of cavity 300 are bounded by protective material 130 and protective material 140. An adhesive layer 160 placed on protective material 130 seats against shoulder 240. Similarly, an adhesive layer 170 placed on protective material 140 seats against shoulder 230. Adhesive layer 160 and adhesive layer 170 seal cavity 300 from the ambient atmosphere when lid 200 is placed on integrated circuit 100.

FIG. 1 illustrates a cross section of integrated circuit 100 and lid 200. It is understood that cavity 300 is also bounded on the two additional sides (not shown in FIG. 1) that are parallel to the cross section direction. Ii is understood that cavity 300 is also sealed from the ambient atmosphere on the two additional sides. This may be more clearly seen by referring to FIG. 4.

In an advantageous embodiment of the invention, lid 200 is formed having portions that define a first fluid conduit 250 and a second fluid conduit 270 through lid 200. First fluid conduit 250 is connected to fluid conduit connector 260 and second fluid conduit 270 is connected to fluid conduit connector 280. Fluid conduit connector 260 is capable of being connected to a fluid source (not shown) or, alternatively, to a fluid sink (not shown). Similarly, fluid conduit connector 280 is capable of being connected to a fluid source (not shown) or, alternatively, to a fluid sink (not shown).

As shown in FIG. 1, first fluid conduit 250 and second fluid conduit 270 have access to cavity 300. It is therefore possible to transport fluid from a fluid source (not shown) through fluid conduit connector 260, through first fluid conduit 250, through cavity 300, through second fluid conduit 270, and through fluid conduit connector 280 to a fluid sink (not shown). The direction of fluid flow described above may also be reversed. That is, it is also possible to transport fluid from a fluid source (not shown) through fluid conduit connector 280, through second fluid conduit 270, through cavity 300, through first fluid conduit 250, and through fluid conduit connector 260 to a fluid sink (not shown).

Figure 2:
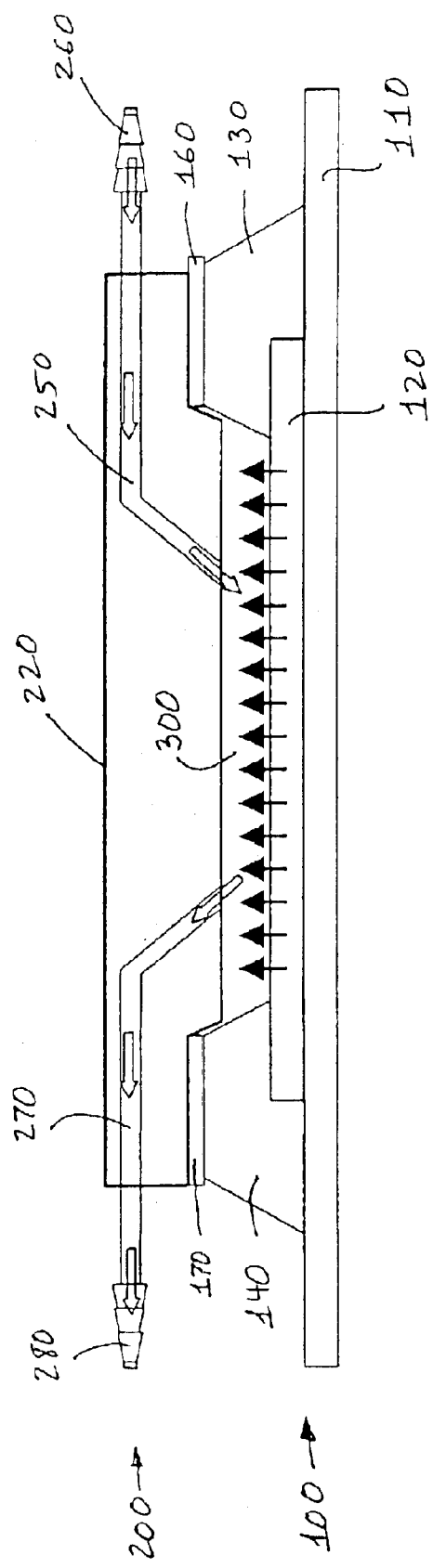
FIG. 2 illustrates a cross sectional view of the integrated circuit shown in FIG. 1 in which the lid comprising first and second fluid conduits is placed in contact with the integrated circuit to form a cavity between a surface of the lid and the exposed surface of the integrated circuit die and in which fluid is passed through the first fluid conduit of the lid, through the cavity, and through the second fluid conduit of the lid.

FIG. 2 illustrates the case in which fluid is transported through first fluid conduit 250, through cavity 300, and through second fluid conduit 270. As the fluid passes through cavity 300 heat that is generated by integrated circuit die 120 passes into the fluid. That is, the fluid absorbs heat by direct convection from exposed surface 150 of integrated circuit die 120. The heat convection is shown in FIG. 2 as a parallel row of arrows.

The fluid removes heat from cavity 300 through second fluid conduit 270 and fluid conduit connector 280 to a fluid sink (not shown). The heat in the fluid from cavity 300 may be removed by subsequent cooling at a location (not shown) that is external to the combination of integrated circuit 100 and lid 200. The cooled fluid may then be returned to fluid conduit connector 260 and passed through first fluid conduit 250 to cavity 300 to be reused in cavity 300 to again remove heat from integrated circuit die 120.

In the advantageous embodiment of the invention shown in the drawings, first fluid conduit 250 and second fluid conduit 270 are cylindrically shaped conduits having circular cross sections. However, the present invention is not limited to cylindrically shaped conduits and the conduits may have square cross sections, rectangular cross sections, oval cross sections, irregular cross sections, or cross sections of other geometrical shapes. The lengths of the conduits are not limited to straight lines. That is, the lengths of the conduits may have a curvilinear shape or may have any irregular shape.

The present invention permits direct convective cooling of the active area of integrated circuit 100 (i.e., integrated circuit die 120) by allowing the cooling fluid direct contact with exposed surface 150 of integrated circuit die 120. The cooling fluid may be either a gas or a liquid. Exposed surface 150 of integrated circuit die 120 may be protected from chemical action of the fluid by one or more chemically inert inorganic passivation layers. Alternatively, exposed surface 150 may be covered with an organic coating to protect integrated circuit die 120 from the chemical action of the fluid. The organic coating may either replace or supplement chemically inert inorganic passivation layers.

The term "integrated circuit" and the term "integrated circuit package" may also be used to refer to the combined assembly of the lid 200, the substrate 110, the integrated circuit die 150, the protective material 130, the protective material 140, the electrical leads (not shown), and the metal layer (not shown) that is located on substrate 110.

In integrated circuits the protective material 130 and the protective material 140 encapsulate and protect the electrical leads that form electrical connections with integrated circuit die 120. In the present invention the protective material 130 and the protective material 140 also protect the electrical leads from any harmful effects of the cooling fluid. The protective material 130 and the protective material 140 protect the electrical leads in three ways. First, the electrical leads are protected mechanically from the effects of turbulent fluid motion, if any, of the cooling fluid. Second, the electrical leads are protected electrically from the electrical conducting properties, if any, of the cooling fluid. Third, the electrical leads are protected chemically from the chemical action of chemicals or contaminants, if any, in the cooling fluid.

An additional mechanism for the removal of heat from cavity 300 is the convective transfer of heat from the fluid in cavity 300 to lid 200. As lid 200 receives heat from the fluid in cavity 300 lid 200 transfers the heat to the ambient atmosphere through exterior surface 220. This additional mechanism for the removal of heat from cavity 300 may be enhanced by the use of a lid 200 that is made of a thermally conductive material. The thermally conductive material may comprises a metal, a polymer, a ceramic, or some other similar thermally conductive material.

Figure 3:
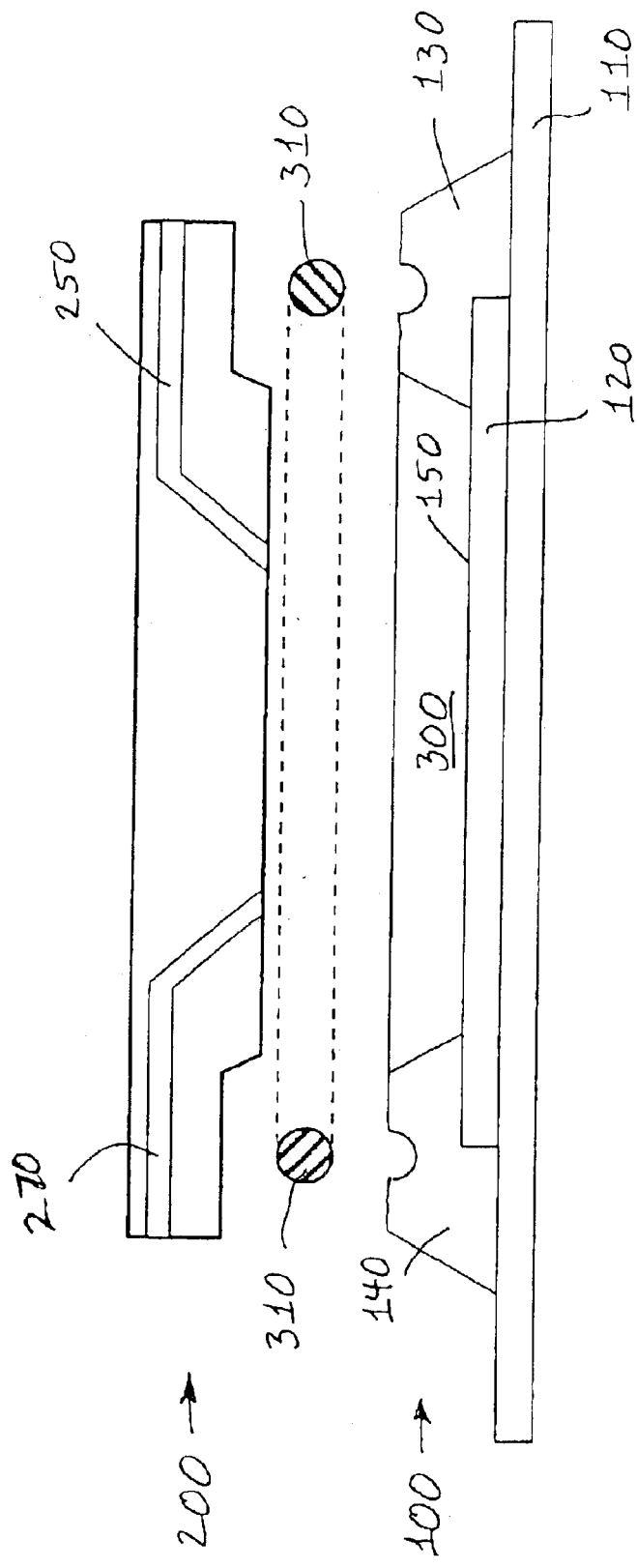
FIG. 3 illustrates a cross sectional view of a first alternate advantageous embodiment of the present invention in which the integrated circuit has portions adapted to receive an O-ring to seal a juncture between the lid and the integrated circuit when the lid is placed in contact with the integrated circuit.

FIG. 3 illustrates a cross sectional view of a first alternate advantageous embodiment of the present invention in which protective material 130 and protective material 140 of integrated circuit 100 have portions that are adapted to receive an O-ring 310. O-ring 310 is capable of sealing a juncture between lid 200 and protective material 130 and protective material 140 of integrated circuit 100. O-ring 310 seals cavity 300 from the ambient atmosphere when lid 200 is placed on integrated circuit 100. In this first alternate advantageous embodiment of the invention lid 200 may be attached to integrated circuit 100 with one or more mechanical connectors (not shown). The mechanical connectors may be screws, posts, clips, or other similar mechanical devices.

Figure 4:
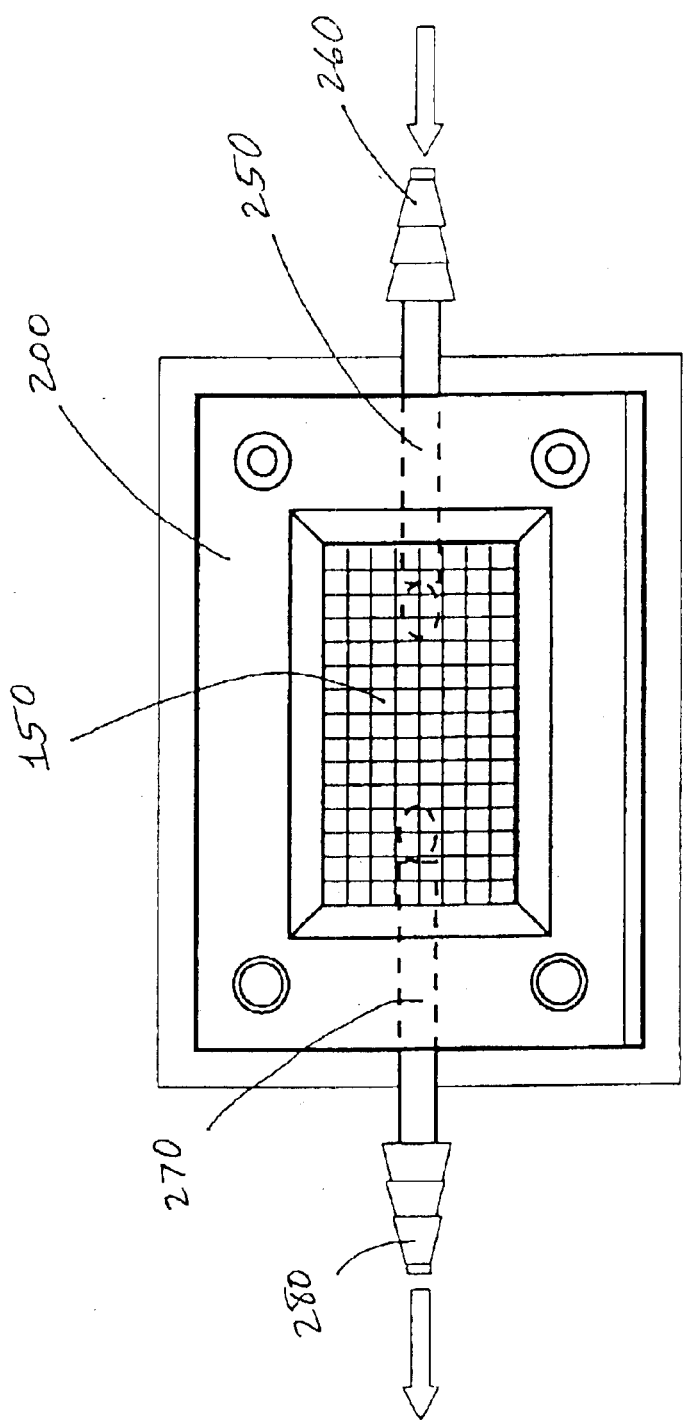
FIG. 4 illustrates a plan view of the integrated circuit and lid shown in FIG. 2 illustrating the location of the first and second fluid conduits within the lid and the placement of the first and second fluid conduits with respect to the exposed surface of the integrated circuit die.

FIG. 4 illustrates a plan view of the integrated circuit 100 and lid 200 shown in FIG. 2. FIG. 4 illustrates an exemplary location of first fluid conduit 250 and an exemplary location of second fluid conduit 270 within lid 200. The square hatched area in FIG. 4 represents the exposed surface 150 of integrated circuit die 120 at the bottom of cavity 300.

Figure 5:
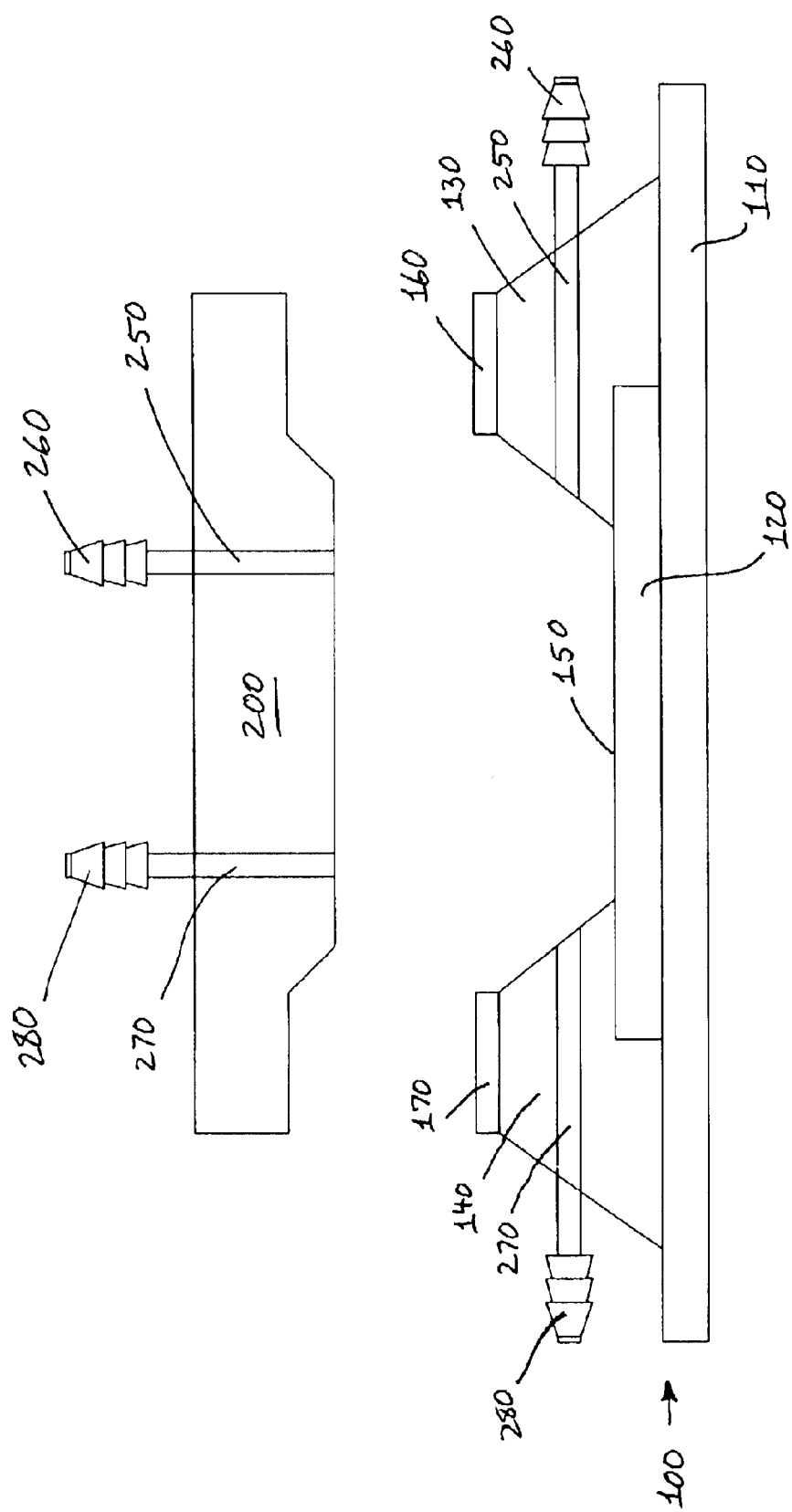
FIG. 5 illustrates a cross sectional view of a second alternate advantageous embodiment of the present invention in which the first and second fluid conduits are disposed vertically within the lid and a third alternate advantageous embodiment of the present invention in which the first and second fluid conduits are located within portions of the integrated circuit.

FIG. 5 illustrates a cross sectional view of a second alternate advantageous embodiment of the present invention in which first fluid conduit 250 and second fluid conduit 270 are disposed vertically within lid 200. The first fluid conduit 250 and the second fluid conduit 270 shown in FIGS. 1–4 were disposed laterally within lid 200. The structure illustrated in FIG. 5 shows that first fluid conduit 250 and the second fluid conduit 270 may be disposed in a plurality of directions.

FIG. 5 also illustrates a cross sectional view of a third alternate advantageous embodiment of the present invention in which first fluid conduit 250 is located within protective material 130 of integrated circuit 100 and second fluid conduit 270 is located within protective material 140 of integrated circuit 100. In this embodiment the fluid is introduced to cavity 300 through first fluid conduit 250 through protective material 130. The fluid is removed from cavity 300 through second fluid conduit 270 through protective material 140. In this embodiment lid 200 is solid and there are no conduits through lid 200.

It is possible that the second fluid conduit 270 through protective material 140 in FIG. 5 could be replaced with a second fluid conduit 270 through lid 200. That is, the fluid could be introduced to cavity 300 through a first fluid conduit through protective material 140 and removed through a second fluid conduit through lid 200.

Similarly, it is possible that the first fluid conduit 250 through protective material 130 in FIG. 5 could be replaced with a first fluid conduit 250 through lid 200. That is, the fluid could be introduced to cavity 300 through a first fluid conduit through lid 200 and removed through a second fluid conduit through protective material 140. Other arrangements are also possible.

Figure 6:
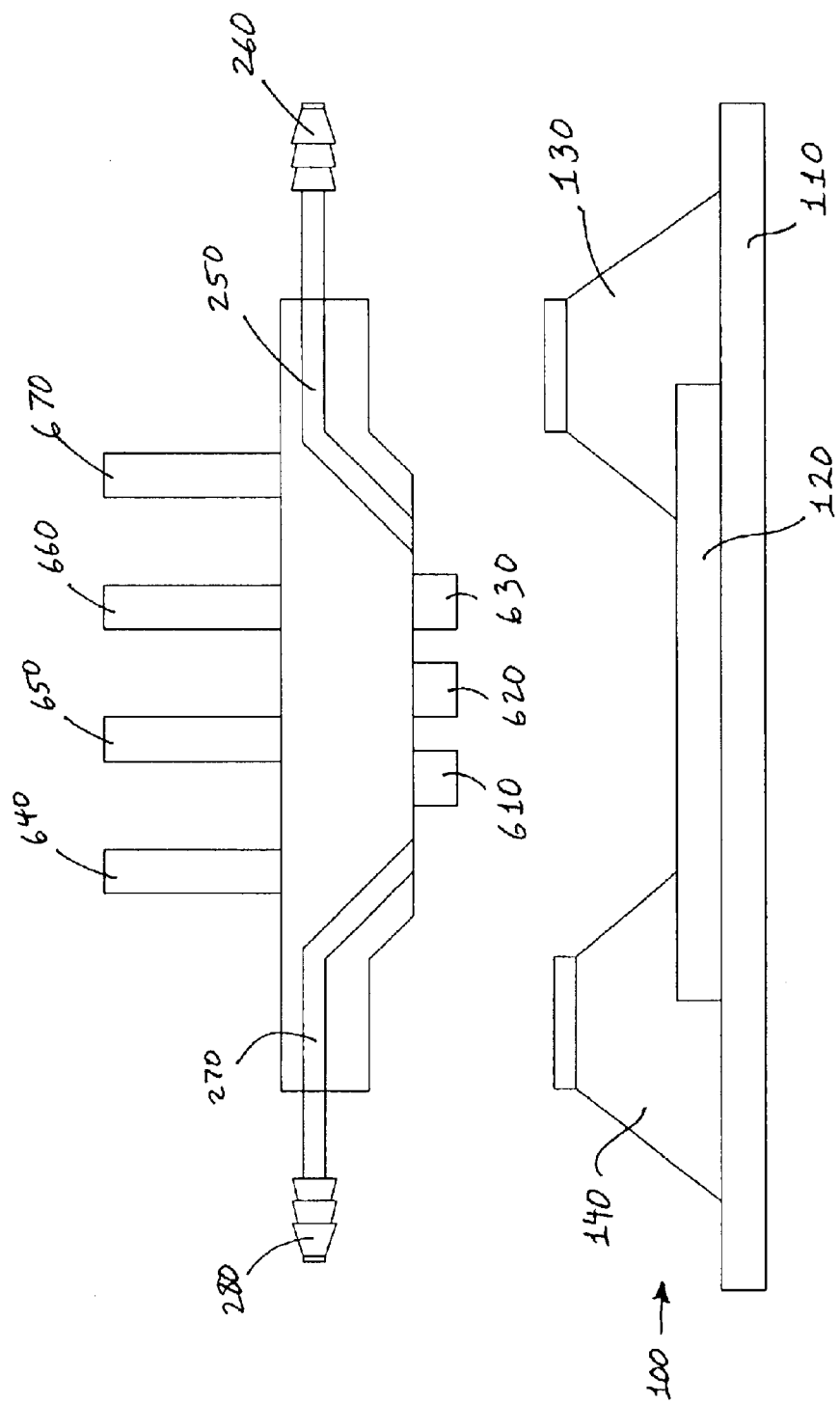
FIG. 6 illustrates a cross sectional view of a fourth alternate advantageous embodiment of the present invention in which an interior surface of the lid has portions that define a plurality of vanes that direct the flow of fluid through the cavity and in which an exterior surface of the lid has portions that define a plurality of cooling fins that transfer heat from the lid to the atmosphere.

FIG. 6 illustrates a cross sectional view of a fourth alternate advantageous embodiment of the present invention in which interior surface 210 of lid 200 has portions that define a plurality of vanes 610, 620, 630. Vanes 610, 620, 630 may be used to direct the flow of fluid through cavity 300 to ensure that the flow of the fluid completely covers exposed surface 150 of integrated circuit die 120. In one advantageous embodiment of the invention vanes 610, 620, 630 extend into cavity 300 sufficiently far to deflect a major portion of the fluid flow over all of exposed surface 150. Three vanes are shown as an example. More than three vanes may be used or fewer than three vanes may be used.

FIG. 6 also illustrates that exterior surface 220 of lid 200 has portions that define a plurality of cooling fins 640, 650, 660 and 670. Cooling fins 640, 650, 660 and 670 transfer heat from lid 200 to the ambient atmosphere. Four cooling fins are shown as an example. More than four cooling fins may be used or fewer than four cooling fins may be used.

Figure 7:
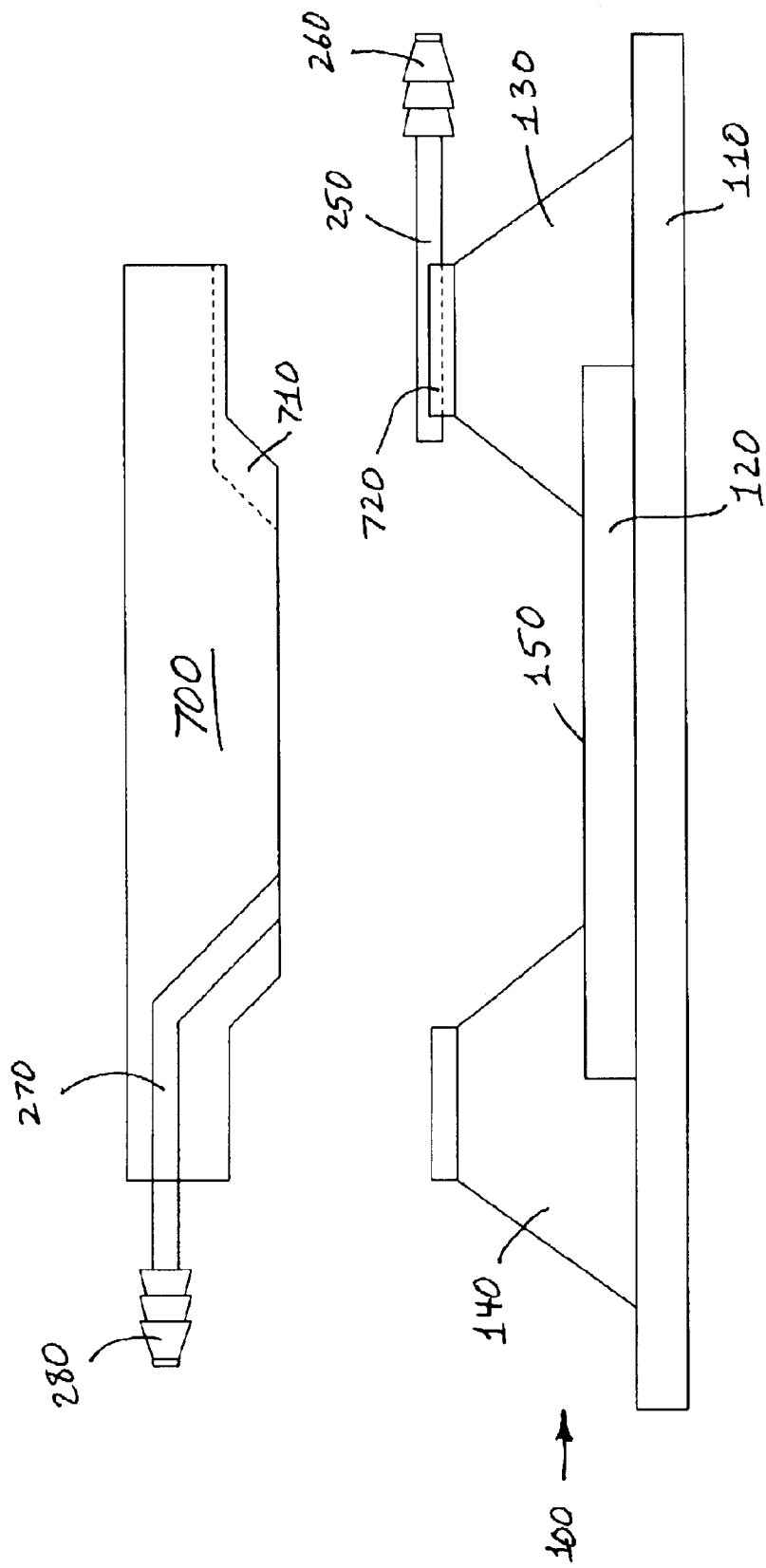
FIG. 7 illustrates a cross sectional view of a fifth alternate advantageous embodiment of the present invention in which the lid is formed having portions that define a first portion of a first fluid conduit and the integrated circuit is formed having portions that define a second portion of the first fluid conduit so that the first fluid conduit is formed between the lid and the integrated circuit when the lid is in contact with the integrated circuit.

FIG. 7 illustrates a cross sectional view of a fifth alternate advantageous embodiment of the present invention in which lid 700 is formed having portions that define a first portion 710 of a fluid conduit 250 and in which protective material 130 of integrated circuit 100 is formed having portions that define a second portion 720 of the fluid conduit 250. Fluid conduit 250 is formed between lid 700 and protective material 130 of integrated circuit 100 when lid 700 is in contact with integrated circuit 100. That is, one half of fluid conduit 250 is formed by portions of lid 700 and one half of fluid conduit 250 is formed by portions of protective material 130. Fluid conduit 250 is shown in FIG. 7 as a cylindrically shaped conduit having a circular cross section. However, as previously described, the present invention is not limited to cylindrically shaped conduits. Fluid conduit 250 in FIG. 7 may also be formed having other shapes.

Figure 8:
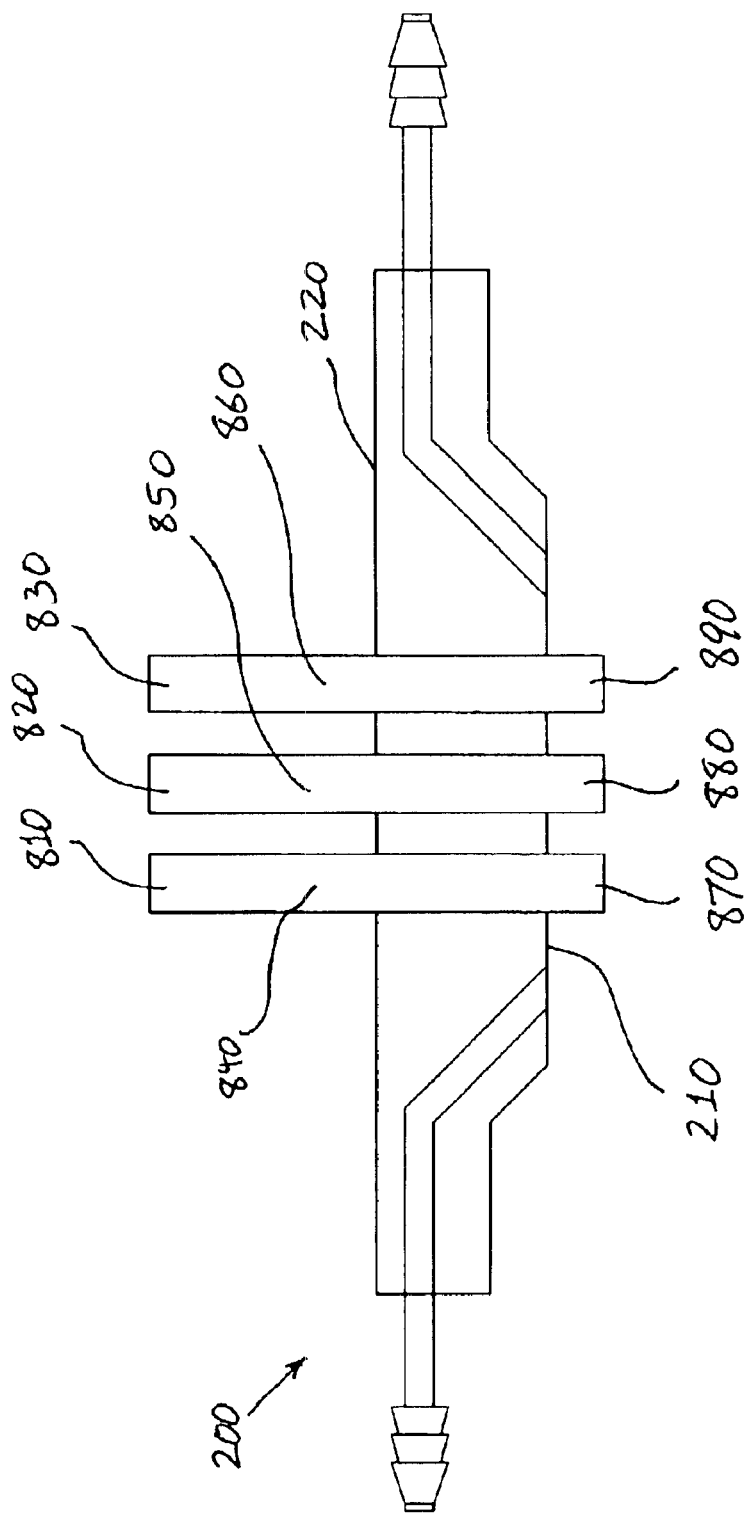
FIG. 8 illustrates an alternate advantageous embodiment of the lid in which fins that extend through the top surface of the lid and vanes that extend through the bottom surface of the lid are both formed from one piece of heat conducting material.

FIG. 8 illustrates an alternate advantageous embodiment of lid 200 in which fin 810 that extends through top surface 220 of lid 200 and vane 870 that extends through bottom surface 210 of lid 200 are both formed from one piece 840 of heat conducting material. A plurality of fin/vane combinations may also be used with lid 200. FIG. 8 illustrates a lid 200 that has a first piece 840 that comprises fin 810 and vane 870, a second piece 850 that comprises fin 820 and vane 880, and a third piece 860 that comprises fin 830 and vane 890. The use of three pieces, 840, 850 and 860, is shown as an example. It is understood that more than three pieces or fewer than three pieces may be used. The design illustrated in FIG. 8 maximizes the removal of additional heat from cavity 300 by providing a direct path for the conduction of heat from the fluid in cavity 300 into the ambient atmosphere. For example, heat is conducted from the fluid in cavity 300 into vane 870 of piece 840, through the body of piece 840, through fin 810 of piece 840, and into the ambient atmosphere.

Figure 9:
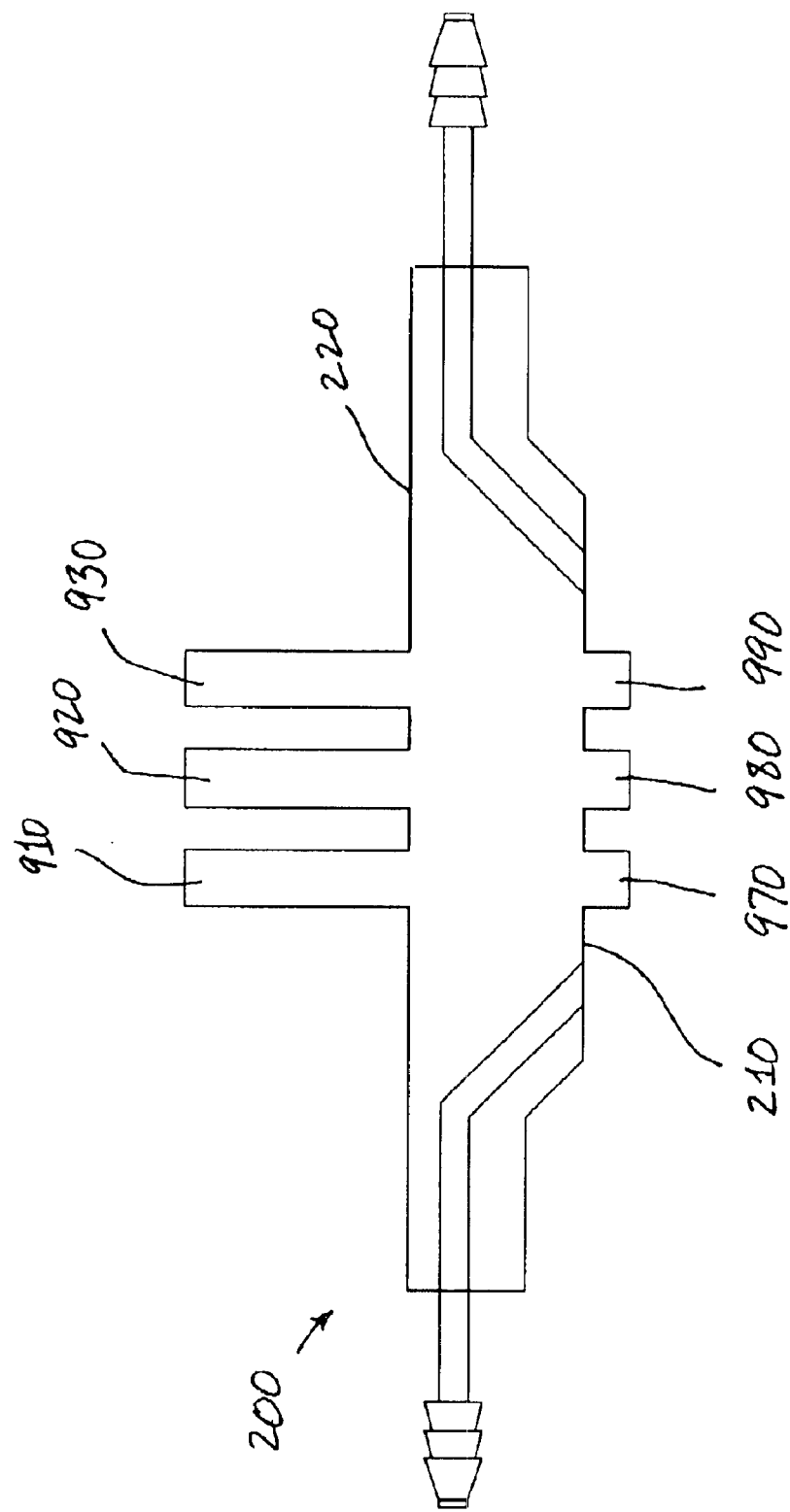
FIG. 9 illustrates an alternate advantageous embodiment of the lid in which the fins that extend from the top surface of the lid and the vanes that extend from the bottom surface of the lid are manufactured as integral parts of the lid.

FIG. 9 illustrates an alternate advantageous embodiment of lid 200 in which the fins 910, 920 and 930, that extend from the top surface 220 of lid 200 and the vanes 970, 980 and 990 that extend from the bottom surface 210 of lid 200 are manufactured as integral parts of lid 200. The heat flow process is the same as that described for lid 200 illustrated in FIG. 8. It is understood that either the fins 910, 920 and 930, or the vanes 970, 980 and 990, (or both) may be manufactured as part of lid 200. The case where the fins and the vanes are manufactured separately and attached to lid 200 has been previously shown in FIG. 6.

Figure 10:
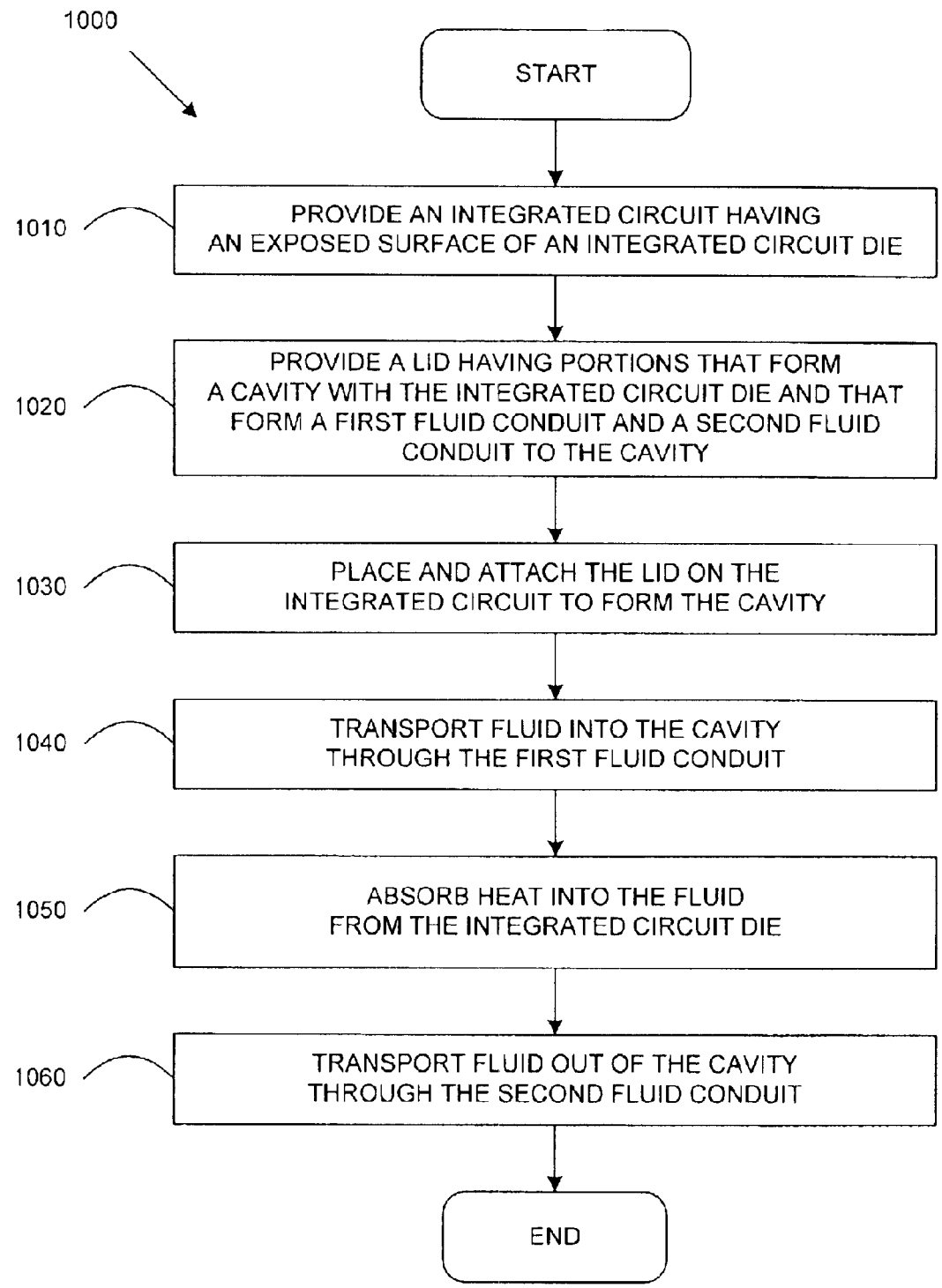
FIG. 10 illustrates a flow chart that shows an operation of an advantageous embodiment of a method of the present invention.

FIG. 10 illustrates a flow chart that shows an operation of an advantageous embodiment of a method of the present invention. The steps of the method shown in FIG. 10 are collectively referred to with reference numeral 1000.

In the first step an integrated circuit 100 of the type that has an exposed surface 150 of an integrated circuit die 120 is provided. (Step 1010). In the second step a lid 200 is provided in which lid 200 has portions that define a cavity 300 with respect to integrated circuit die 120 when lid 200 is placed in contact with integrated circuit 100. As previously described, lid 200 also has portions that form a first fluid conduit 250 and a second fluid conduit 270 through lid 200 to cavity 300. (Step 1020).

Lid 200 is then placed into contact with and attached to integrated circuit 100 to form cavity 300. (Step 1030). Fluid is then transported though first fluid conduit 250 into cavity 300. (Step 1040). Heat from integrated circuit die 120 is then absorbed into the fluid in cavity 300. (Step 1050). Fluid is then transported out of cavity 300 though second fluid conduit 270. (Step 1060).

The present invention has been described with reference to a substrate style integrated circuit package. The present invention is not limited to use with a specific style of integrated circuit package. The present invention may be used with a Ball Grid Array (BGA) style integrated circuit package, or with a leaded style integrated circuit package, or generally with any type of molded integrated circuit package.

Figure 11:
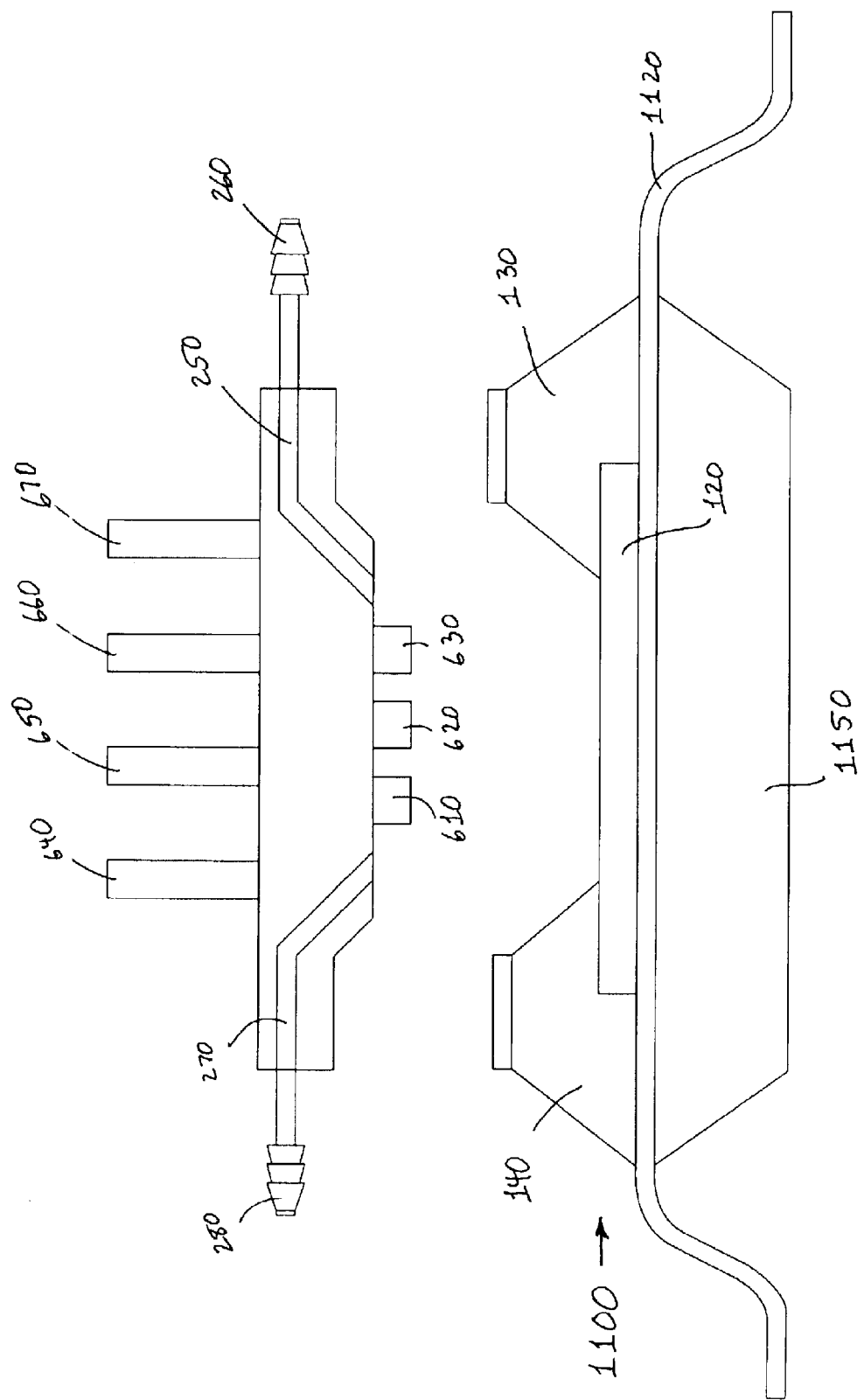
FIG. 11 illustrates an alternate advantageous embodiment of the present invention used in conjunction with an integrated circuit comprising a leaded style integrated circuit package.

FIG. 11 illustrates an alternate advantageous embodiment of the lid 200 of the present invention as shown in FIG. 6 used in conjunction with an integrated circuit 1100 comprising a leaded style integrated circuit package. Integrated circuit 1100 comprises protective material 130, protective material 140, integrated circuit die, lead frame 1120, and protective material 1150 encapsulating lead frame 1120. The use of lid 200 and the use of cooling fluid to cool integrated circuit 1100 is the same as that previously described with respect to integrated circuit 100.

Although the present invention has been described in detail, those skilled in the art should understand that they could make various changes, substitutions and alterations herein without departing from the spirit and scope of the invention in its broadest form.

What is claimed is:

1. An apparatus for cooling an integrated circuit of the type comprising an integrated circuit die having an exposed surface, said apparatus comprising:

a lid capable of being placed in contact with said integrated circuit, said lid having portions that form a cavity between a surface of said lid and said exposed surface of said integrated circuit die when said lid is placed in contact with said integrated circuit;

wherein said lid comprises portions that form within said lid a first fluid conduit for transporting a fluid from a location outside said integrated circuit into said cavity;

wherein said lid comprises portions that form within said lid a second fluid conduit for transporting said fluid from said cavity to a location outside of said integrated circuit after said fluid has absorbed heat from said integrated circuit die; and wherein said lid comprises at least one vane on an interior surface of said lid.

2. The apparatus as claimed in claim 1 wherein said lid is attached to said integrated circuit with an adhesive that seals said cavity so that said fluid has access to said cavity only through said first and second fluid conduits.

3. The apparatus as claimed in claim 1 wherein said lid is attached to said integrated circuit with at least one mechanical connector and with an O-ring that seals said cavity so that said fluid has access to said cavity only through said first and second fluid conduits.

4. The apparatus as claimed in claim 1 wherein said lid further comprises at least one cooling fin on an exterior surface of said lid.

5. The apparatus as claimed in claim 1 wherein said fluid comprises one of: a gas and a liquid.

6. The apparatus as claimed in claim 1 wherein in order to protect said integrated circuit die from chemical action of said fluid said integrated circuit die is covered with one of: a chemically inert inorganic passivation layer and an organic coating.

7. The apparatus as claimed in claim 1 wherein said lid is made of thermally conductive material.

8. The apparatus as claimed in claim 7 wherein said thermally conductive material comprises one of: a metal, a polymer and a ceramic.

9. The apparatus as claimed in claim 1 wherein said first fluid conduit and said second fluid conduit are laterally disposed within said lid.

10. The apparatus as claimed in claim 1 wherein said first fluid conduit and said second fluid conduit are vertically disposed within said lid.

11. The apparatus as claimed in claim 4 wherein said at least one vane on said interior surface of said lid is formed as an integral part of said lid.

12. The apparatus as claimed in claim 4 wherein said at least one fin on said exterior surface of said lid is formed as an integral part of said lid.

13. An apparatus for cooling an integrated circuit of the type comprising an integrated circuit die having an exposed surface, said apparatus comprising:

a lid capable of being placed in contact with said integrated circuit, said lid having portions that form a cavity between a surface of said lid and said exposed surface of said integrated circuit die when said lid is placed in contact with said integrated circuit;

wherein said lid comprises portions that form within said lid a first fluid conduit for transporting a fluid from a location outside said integrated circuit into said cavity;

wherein said lid comprises portions that form within said lid a second fluid conduit for transporting said fluid from said cavity to a location outside of said integrated circuit after said fluid has absorbed heat from said integrated circuit die; and wherein said lid comprises at least one vane on an interior surface of said lid and at least one cooling fin on an exterior surface of said lid wherein said at least one vane and said at least one fin are both formed from a single piece of thermally conductive material that extends through said lid.

14. An apparatus for cooling an integrated circuit of the type comprising an integrated circuit die having an exposed surface, said apparatus comprising:

a lid capable of being placed in contact with said integrated circuit, said lid having portions that form a cavity between a surface of said lid and said exposed surface of said integrated circuit die when said lid is placed in contact with said integrated circuit;

wherein said integrated circuit comprises portions that form within said integrated circuit a first fluid conduit for transporting a fluid from a location outside said integrated circuit into said cavity; and wherein said integrated circuit comprises portions that form within said integrated circuit a second fluid conduit for transporting said fluid from said cavity to a location outside of said integrated circuit after said fluid has absorbed heat from said integrated circuit die.

15. An apparatus as claimed in claim 14 wherein said lid comprises one of: at least one vane on an interior surface of said lid and at least one cooling fin on an exterior surface of said lid.

16. The apparatus as claimed in claim 14 wherein said lid comprises at least one vane on an interior surface of said lid and at least one cooling fin on an exterior surface of said lid wherein said at least one vane and said at least one fin are both formed from a single piece of thermally conductive material that extends through said lid.

17. The apparatus as claimed in claim 15 wherein said at least one vane on said interior surface of said lid is formed a s an integral part of said lid.

18. The apparatus as claimed in claim 15 wherein said at least one fin on said exterior surface of said lid is formed as an integral part of said lid.

19. An apparatus for cooling an integrated circuit of the type comprising an integrated circuit die having an exposed surface, said apparatus comprising:

a lid capable of being placed in contact with said integrated circuit, said lid having portions that form a cavity between a surface of said lid and said exposed surface of said integrated circuit die when said lid is placed in contact with said integrated circuit;

wherein said lid comprises portions that form within said lid at least one first fluid conduit for transporting a fluid into or out of said cavity; and wherein said integrated circuit comprises portions that form within said integrated circuit at least one second fluid conduit for transporting said fluid into or out of said cavity.

20. The apparatus as claimed in claim 19 wherein said at least one first fluid conduit in said lid transports said fluid into said cavity from a location outside of said cavity; and wherein said at least one second fluid conduit in said integrated circuit transports said fluid out of said cavity to a location outside of said cavity after said fluid has absorbed heat from said integrated circuit die.

21. The apparatus as claimed in claim 19 wherein said at least one second fluid conduit in said integrated circuit transports said fluid into said cavity from a location outside of said cavity; and wherein said at least one first fluid conduit in said lid transports said fluid out of said cavity to a location outside of said cavity after said fluid has absorbed heat from said integrated circuit die.

22. An apparatus for cooling an integrated circuit of the type comprising an integrated circuit die having an exposed surface, said apparatus comprising:

a lid capable of being placed in contact with said integrated circuit, said lid having portions that form a cavity between a surface of said lid and said exposed surface of said integrated circuit die when said lid is placed in contact with said integrated circuit;

wherein said lid comprises portions that form within said lid a first portion of a fluid conduit that provides access to said cavity;

wherein said integrated circuit comprises portions that form within said integrated circuit a second portion of said fluid conduit that provides access to said cavity; and wherein said first portion of said fluid conduit in said lid and said second portion of said fluid conduit in said integrated circuit form said fluid conduit that provides access to said cavity when said lid is in contact with said integrated circuit.

23. A method for cooling an integrated circuit of the type comprising an integrated circuit die having an exposed surface, said method comprising the steps of:

placing a lid in contact with said integrated circuit to form a cavity between an interior surface of said lid and said exposed surface of said integrated circuit die, wherein said lid comprises at least one vane on said interior surface of said lid;

transporting a fluid into said cavity through a first fluid conduit in said lid from a location outside said integrated circuit;

absorbing heat into said fluid from said integrated circuit die; and transporting said fluid out of said cavity through a second fluid conduit in said lid to a location outside said integrated circuit after said fluid has absorbed said heat from said integrated circuit die.

24. The method as claimed in claim 23 further comprising the step of:

directing the flow of said fluid over said integrated circuit die with said at least one vane on said interior surface of said lid.

25. The method as claimed in claim 23 further comprising the steps of:

absorbing head from said integrated circuit die into said lid; and absorbing heat from said lid into an ambient atmosphere outside of said integrated circuit through at least one cooling fin attached to an external surface of said lid.

26. The method as claimed in claim 23 further comprising the step of:

covering said integrated circuit die with an organic coating to protect said integrated circuit die from chemical action of said fluid.

27. A method for cooling an integrated circuit of the type comprising an integrated circuit die having an exposed surface, said method comprising the steps of:

placing a lid in contact with said integrated circuit to form a cavity between an interior surface of said lid and said exposed surface of said integrated circuit die;

transporting a fluid into said cavity through a first fluid conduit in said lid from a location outside said integrated circuit;

absorbing heat into said fluid from said integrated circuit die;

transporting said fluid out of said cavity through a second fluid conduit in said lid to a location outside said integrated circuit after said fluid has absorbed said heat from said integrated circuit die;

absorbing heat from said integrated circuit die into a piece of thermally conductive material that extends through said lid wherein said piece of thermally conducting material comprises at least one vane on an interior surface of said lid and at least one cooling fin on an exterior surface of said lid; and absorbing heat into an ambient atmosphere outside of said integrated circuit through said at least one cooling fin.

28. A method for cooling an integrated circuit of the type comprising an integrated circuit die having an exposed surface, said method comprising the steps of:

placing a lid in contact with said integrated circuit to form a cavity between a surface of said lid and said exposed surface of said integrated circuit die;

providing within said lid at least one first fluid conduit for transporting a fluid into or out of said cavity; and providing within said integrated circuit at least one second fluid conduit for transporting said fluid into or out of said cavity.

29. The method as claimed in claim 28 further comprising the steps of:

transporting said fluid into said cavity through said at least one first fluid conduit in said lid from a location outside said integrated circuit; and absorbing heat into said fluid from said integrated circuit die; and transporting said fluid out of said cavity through said at least one second fluid conduit in said integrated circuit to a location outside said integrated circuit after said fluid has absorbed heat from said integrated circuit die.

30. The method as claimed in claim 28 further comprising the steps of:

transporting said fluid into said cavity through said at least one second fluid conduit in said integrated circuit from a location outside said integrated circuit; and absorbing heat into said fluid from said integrated circuit die; and transporting said fluid out of said cavity through said at least one first fluid conduit in said lid to a location outside said integrated circuit after said fluid has absorbed heat from said integrated circuit die.

31. The method as claimed in claim 28 further comprising the steps of:

absorbing heat from said integrated circuit die into a piece of thermally conductive material that extends through said lid wherein said piece of thermally conducting material comprises at least one vane on an interior surface of said lid and at least one cooling fin on an exterior surface of said lid; and absorbing heat into an ambient atmosphere outside of said integrated circuit through said at least one cooling fin.

32. A method for cooling an integrated circuit of the type comprising an integrated circuit die having an exposed surface, said method comprising the steps of:

placing a lid in contact with said integrated circuit to form a cavity between a surface of said lid and said exposed surface of said integrated circuit die;

transporting a fluid into said cavity through a first fluid conduit in said integrated circuit from a location outside said integrated circuit;

absorbing heat into said fluid from said integrated circuit die; and transporting said fluid out of said cavity through a second fluid conduit in said integrated circuit to a location outside said integrated circuit after said fluid has absorbed said heat from said integrated circuit die.

33. The method as claimed in claim 32 wherein said step of providing within said lid at least one first fluid conduit for transporting a fluid into or out of said cavity further comprises the steps of:

forming within said lid a first portion of said first fluid conduit that provides access to said cavity;

forming within said integrated circuit a second portion of said first fluid conduit that provides access to said cavity; and wherein said first portion of said first fluid conduit in said lid and said second portion of said first fluid conduit in said integrated circuit form said first fluid conduit that provides access to said cavity when said lid is in contact with said integrated circuit.

34. The method as claimed in claim 32 wherein said step of providing within said integrated circuit at least one second fluid conduit for transporting a fluid into or out of said cavity further comprises the steps of:

forming within said integrated circuit a first portion of said second fluid conduit that provided access to said cavity;

forming within said lid a second portion of said second fluid conduit that provides access to said cavity; and wherein said first portion of said second fluid conduit in said integrated circuit and said second portion of said second fluid conduit in said lid form said second fluid conduit that provides access to said cavity when said lid is in contact with said integrated circuit.

* * * * *